US008932949B2

(12) United States Patent
Cartier et al.

(10) Patent No.: US 8,932,949 B2
(45) Date of Patent: Jan. 13, 2015

(54) FINFET STRUCTURE AND METHOD TO ADJUST THRESHOLD VOLTAGE IN A FINFET STRUCTURE

(71) Applicant: International Business Machines Corporation, Armonk, NY (US)

(72) Inventors: Eduard A. Cartier, New York, NY (US); Brian J. Greene, Fishkill, NY (US); Dechao Guo, Niskayuna, NY (US); Gan Wang, Fishkill, NY (US); Yanfeng Wang, Cupertino, CA (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/258,063

(22) Filed: Apr. 22, 2014

(65) Prior Publication Data

US 2014/0217504 A1   Aug. 7, 2014

Related U.S. Application Data

(62) Division of application No. 13/276,395, filed on Oct. 19, 2011, now Pat. No. 8,772,149.

(51) Int. Cl.
*H01L 21/3205* (2006.01)
*H01L 21/4763* (2006.01)
*H01L 27/12* (2006.01)
*H01L 29/66* (2006.01)
*H01L 21/28* (2006.01)

(52) U.S. Cl.
CPC ...... *H01L 27/1211* (2013.01); *H01L 29/66795* (2013.01); *H01L 21/28017* (2013.01)
USPC .......................................... 438/595; 438/591

(58) Field of Classification Search
USPC ................. 257/321, 347, 368, 369, 391, 392; 438/595, 231, 275, 287, 591, 761
See application file for complete search history.

(56) References Cited

U.S. PATENT DOCUMENTS

| 7,045,401 | B2 | 5/2006 | Lee et al. |
| 7,091,566 | B2 | 8/2006 | Zhu et al. |
| 7,202,517 | B2 | 4/2007 | Dixit et al. |
| 7,348,225 | B2 | 3/2008 | Zhu |
| 7,605,028 | B2 | 10/2009 | Mouli |
| 7,705,345 | B2 | 4/2010 | Bedell et al. |
| 2006/0180866 | A1 | 8/2006 | Zhu et al. |
| 2006/0214226 | A1 | 9/2006 | Chen et al. |
| 2006/0292889 | A1 | 12/2006 | Blanchard et al. |
| 2008/0173942 | A1 | 7/2008 | Zhu et al. |
| 2009/0242964 | A1 | 10/2009 | Akil et al. |
| 2009/0283836 | A1 | 11/2009 | Zhu et al. |

(Continued)

OTHER PUBLICATIONS

International Search Report of the International Searching Authority for Appl. No. PCT/US12/55452, mailing date Nov. 23, 2012.

(Continued)

*Primary Examiner* — Errol Fernandes
(74) *Attorney, Agent, or Firm* — Joseph Abate; Roberts Mlotkowski Safran & Cole, P.C.

(57) ABSTRACT

FinFET structures and methods of manufacturing the FinFET structures are disclosed. The method includes performing an oxygen anneal process on a gate stack of a FinFET structure to induce Vt shift. The oxygen anneal process is performed after sidewall pull down and post silicide.

17 Claims, 5 Drawing Sheets

(56) References Cited

U.S. PATENT DOCUMENTS

| | | |
|---|---|---|
| 2009/0291553 A1 | 11/2009 | Doris et al. |
| 2010/0127336 A1 | 5/2010 | Chambers et al. |
| 2011/0163369 A1 | 7/2011 | Xiao et al. |
| 2011/0215405 A1 | 9/2011 | Guo et al. |

OTHER PUBLICATIONS

Written Opinion of the International Searching Authority for Appl. No. PCT/US12/55452, mailing date Nov. 23, 2012.

FINFET STRUCTURE AND METHOD TO ADJUST THRESHOLD VOLTAGE IN A FINFET STRUCTURE

FIELD OF INVENTION

The invention relates to semiconductor structures and methods of manufacture and, more particularly, to FinFET structures and methods of manufacturing the same.

BACKGROUND

A FinFET is a field effect transistor which has a narrow, active area of a semiconductor material protruding from a substrate so as to resemble a fin. The fin includes source and drain regions, with areas of the fin separated by shallow trench isolation (STI). The FinFET also includes a gate region located between the source and the drain regions. The gate region is formed on a top surface and sidewalls of the fin such that it wraps around the fin. The portion of the fin extending under the gate between the source region and the drain region is the channel region.

FinFETs are regarded as main candidates to replace conventional planar bulk MOSFETs in advanced (beyond 32 nm node) CMOS. This is mainly due to their superior gate control over the channel, resulting in improved short-channel effect immunity and Ion/Ioff ratio.

One type of FinFET is fabricated on silicon on insulator (SOI) wafers, which provides low leakage current from source to drain because there is an oxide layer below the fin which blocks the leakage current. Another type of FinFET is fabricated on conventional bulk silicon wafers. These FinFETs can be considered advantageous due to their lower cost and the option to co-integrate conventional planar bulk FETs and FinFETs in a single product.

The common approach for multi Vt offering is through well doping. In current FinFET processing, however, it is hard to achieve a wide range of threshold voltage solely by well doping in the fins. Moreover, in high-k and metal gate FinFET technology, the gate first integration has become increasingly difficult due to the complexity induced by channel SiGe and NFET and PFET gate stack patterning and RIE (reactive ion etching) processes, with acceptable profile around the fins of the FinFET.

Accordingly, there exists a need in the art to overcome the deficiencies and limitations described hereinabove.

SUMMARY

In an aspect of the invention, a method comprises performing an oxygen anneal process on a gate stack of a FinFET structure to induce Vt shift. The oxygen anneal process is performed post silicide.

In another aspect of the invention, a method comprises forming a plurality of fin structures on an insulator layer. The method further comprises forming a gate stack wrapping around the plurality of fin structures. The gate stack comprises a high-k dielectric material deposited on the plurality of fin structures. The method further comprises adjusting a Vt threshold of the gate stack by subjecting the high-k dielectric material to an oxygen anneal process.

In yet another aspect of the invention, a structure comprises a plurality of fin structures patterned from a semiconductor film. The structure further comprises a gate stack wrapping around the plurality of fin structures. The gate stack includes a high-k dielectric material subjected to a lateral oxygen diffusion to induce Vt shift of the gate stack.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the FinFET structures, which comprises the structures of the present invention. In still further embodiments, a method in a computer-aided design system is provided for generating a functional design model of the FinFET structures. The method comprises generating a functional representation of the structural elements of the FinFET structures.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to FinFET structures and methods of manufacturing the FinFET structures. More specifically, the methods of the present invention provide processes to adjust threshold voltage in FinFET structures, thereby providing the capability of manufacturing (i) low PFET Vt devices without using channel SiGe, and (ii) high NFET Vt devices without increasing well doping. This is accomplished by using a masked spacer RIE and oxygen anneal process.

In embodiments, the method includes pulling down or recessing the spacer sidewall on the gate structure, post silicide, to expose portions of a high-k dielectric material and work function metal of the gate stack. The structure then undergoes a moderate temperature oxygen anneal to fill in oxygen vacancies in the high-k dielectric material, resulting in threshold voltage shift of the gate structure. The process is self-limiting and does not introduce any extra variability.

Advantageously, the present invention eliminates the need for well doping, which cannot achieve a wide range of threshold voltages (Vt range) in FinFET structures. Also, the FinFET structures can undergo self-limiting threshold voltage adjustment, without any device performance degradation. For example, the structure of the present invention does not exhibit any regrowth due to the low temperature oxygen anneal. Moreover, the advantages of the present invention include, amongst others, (i) a simplified fabrication process, by eliminating complex channel SiGe epi and PFET stack metal patterning and RIE processes; (ii) reduced ionized impurity scattering; and (iii) reduced reverse bias junction leakage. Also, the commonly observed narrow channel effect induced by oxygen anneal is avoided in the present invention due to the limited number of design widths in the FinFET structures.

Figure 1:
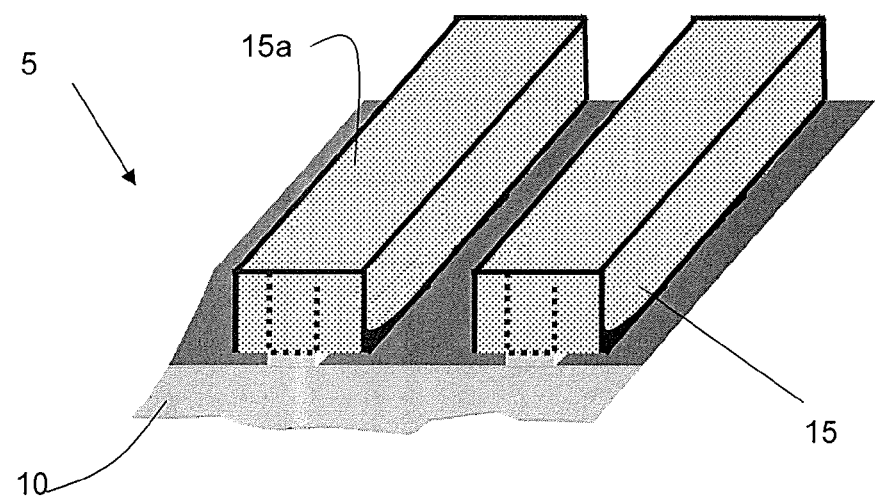
FIGS. 1-6 show structures and respective fabrication processes in accordance with aspects of the present invention.

FIG. 1 shows a structure and respective processing steps in accordance with aspects of the present invention. More specifically, the structure 5 includes an insulator layer 10 and a semiconductor film 15. Although not shown, it should be understood by those of skill in the art that the insulator layer 10 can be provided on a substrate, e.g., any known silicon on insulator (SOI) materials. The insulator layer 10 can be any insulator layer such as, for example, an oxide material. In an SOI implementation, the insulator layer 10 can be a buried oxide layer (BOX) formed by conventional SIMOX processes (Separation by IMplantation of Oxygen) or wafer bonding techniques. In SOI implementations, the semiconductor film 15 can be formed by conventional seed methods. In conventional seed methods, the Si layer is grown directly on the insulator.

In embodiments, the semiconductor film 15 is patterned to form fin structures 15a. The fin structures 15a will form multiple source and drain regions for a gate structure spanning the fin structures 15a. More specifically, the semiconductor film 15 undergoes a conventional lithographic and etching process to form the fin structures 15a. The lithographic process includes depositing a resist on the semiconductor film 15, which is exposed to light to form a pattern (opening). An etching process, e.g., reactive ion etching (RIE), is then performed through the pattern to form the fin structures 15a. The resist can then be removed using a conventional ashing process.

Figure 2:
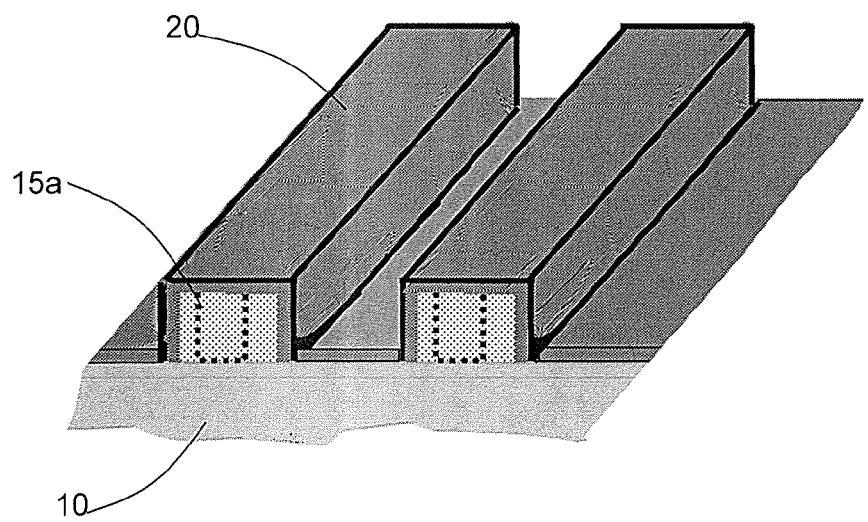

In FIG. 2, a high-k dielectric material 20 is deposited on the fin structures 15a and insulator layer 10. In embodiments, the high-k dielectric material 20 can be blanket deposited using a conventional chemical vapor deposition (CVD) process. The high-k dielectric material can be, for example, $HfO_2$ or $ZrO_2$ or other high-k dielectric materials. Other examples of high-k dielectric materials include hafnium silicate or zirconium silicate, which can be deposited using, for example, CVD or other known processes such as atomic layer deposition (ALD).

Figure 3:
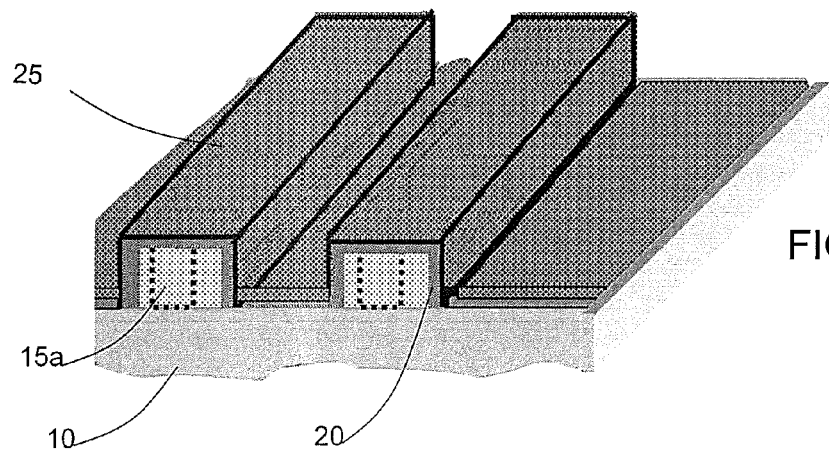

In FIG. 3, one or more work function metals 25 is deposited on the high-k dielectric material 20, using conventional deposition methods such as metal sputtering deposition or CVD. In embodiments, the work function metals 25 can be any appropriate metal for an NFET or PFET device, in order to achieve a desired eV value. For example, the present invention contemplates NMOS and PMOS gates near 4 eV and 5 eV, respectively; although, other values are also contemplated by the present invention. For example, acceptable ranges of work functions can range from about 4.1-4.4 eV for NMOS devices and about 4.8-5.1 eV for PMOS devices. In embodiments, refractory metals can be used as the work function metals. These refractory metals can be, for example, Ta, TaN, Nb for NMOS devices and WN and $RuO_2$ for PMOS devices; although other metals are also contemplated for use by the present invention.

Figure 4:
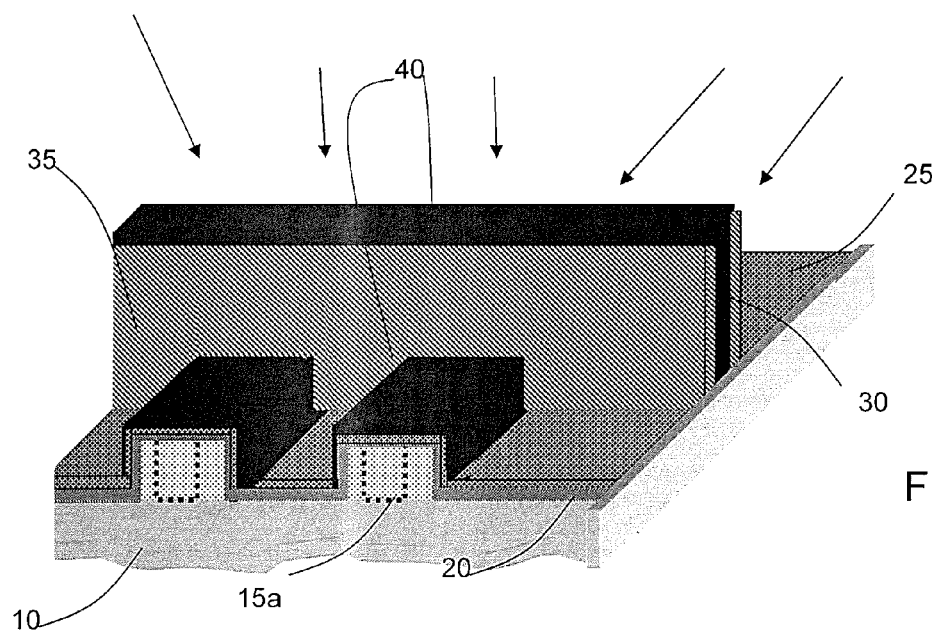

In FIG. 4, a gate stack 30 is deposited and patterned over the one or more work function metal 25. In embodiments, the gate stack 30 includes polysilicon material, which can be blanket deposited using conventional CVD processes. After deposition, the polysilicon material can be patterned using conventional lithographic and etching processes, e.g., RIE, to form the gate stack 30. In embodiments, the gate stack 30 is formed around the fin structures 15a, i.e., sidewalls and top surface. A sidewall spacer 35 is formed on the sidewalls of the gate stack 30. In embodiments, the sidewall spacer 35 is nitride, which can be deposited using a conventional CVD process. Source and drain regions are then formed in the fin structures 15a, on the sides of the gate stack 30 (e.g., adjacent to the sidewall spacer 35) using conventional dopants and processes. The structure then undergoes a conventional annealing process to form silicide regions 40. The annealing process can be, for example, a rapid thermal anneal process (RTA) known to those of skill in the art. The annealing process can be at temperatures ranging from about 650° C. to 1150° C.

Figure 5:
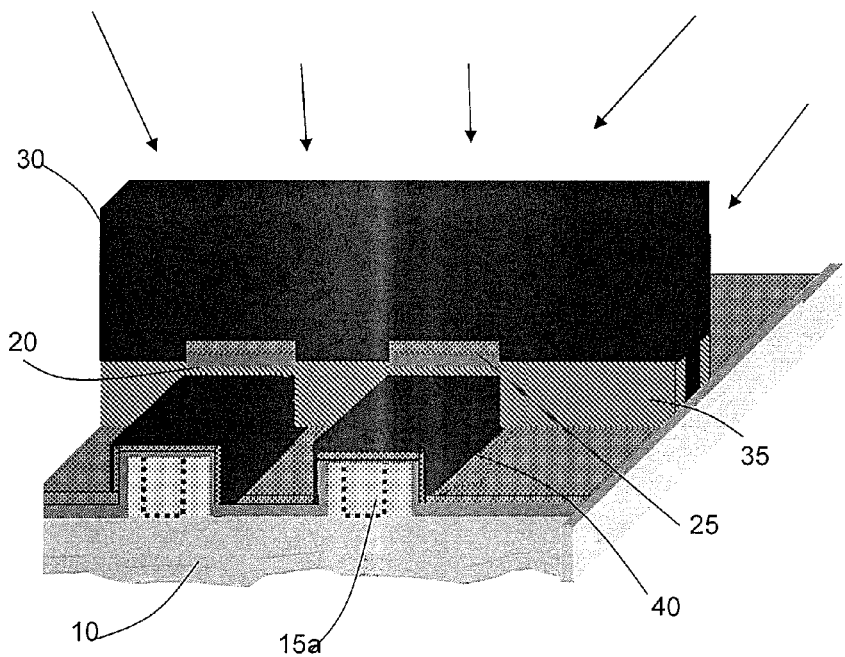

In FIG. 5, the sidewall spacers 35 are recessed or pulled down to expose the one or more work function metals 25 and the high-k dielectric material 20. In embodiments, the sidewall spacers 35 can be recessed or pulled down by using a RIE process to expose part of the gate stack 30 for Vt adjustment. The RIE process includes, for example, the formation of a resist, which is then exposed to light to form a pattern. In embodiments, the pattern is aligned with the sidewall spacers 35. An etching process is then performed to pull down the sidewall spacers 35 to expose the one or more work function metals 25 and the high-k dielectric material 20.

An oxygen anneal process e.g., lateral oxygen diffusion, is then performed on the structure to induce Vt shift. For example, an oxygen anneal of about 400° C. to about 500° C. is performed to induce a desired Vt shift. It should be appreciated by those of skill in the art that there is no regrowth concern since a relatively low temperature anneal is implemented with the present invention. For this reason, there is no performance degradation associated with the Vt shift. In embodiments, the Vt shift can range from 0 to 400 mV, where the process window is determined by thermodynamic and kinematic boundaries.

Figure 6:
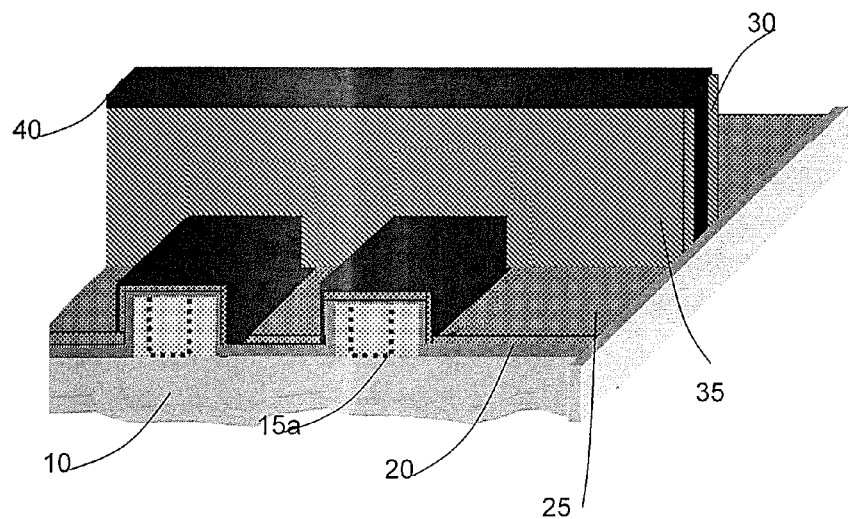

In FIG. 6, additional nitride material can be deposited on the side of the gate stack 30 to complete the sidewall spacer 35. The nitride material can be deposited using a conventional deposition process, for example, CVD.

Figure 7:
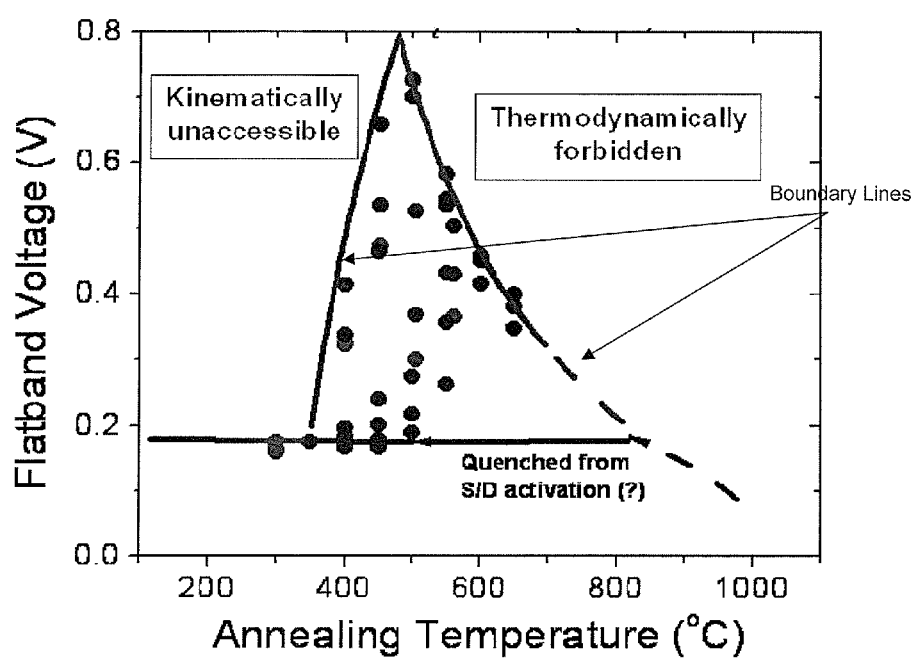
FIG. 7 shows a process window for Vt shift towards edge band in accordance with aspects of the present invention.

FIG. 7 shows a process window for Vt shift towards edge band in accordance with aspects of the present invention. More specifically, FIG. 7 shows a graph of flatband voltage (threshold voltage) vs. annealing temperature (° C.). This graph shows that the processing window is determined by the thermodynamic and kinematic boundaries, as shown by the boundary lines. For example, for large $V_t$ shifts: 400° C.<T <500° C.

Figure 8:
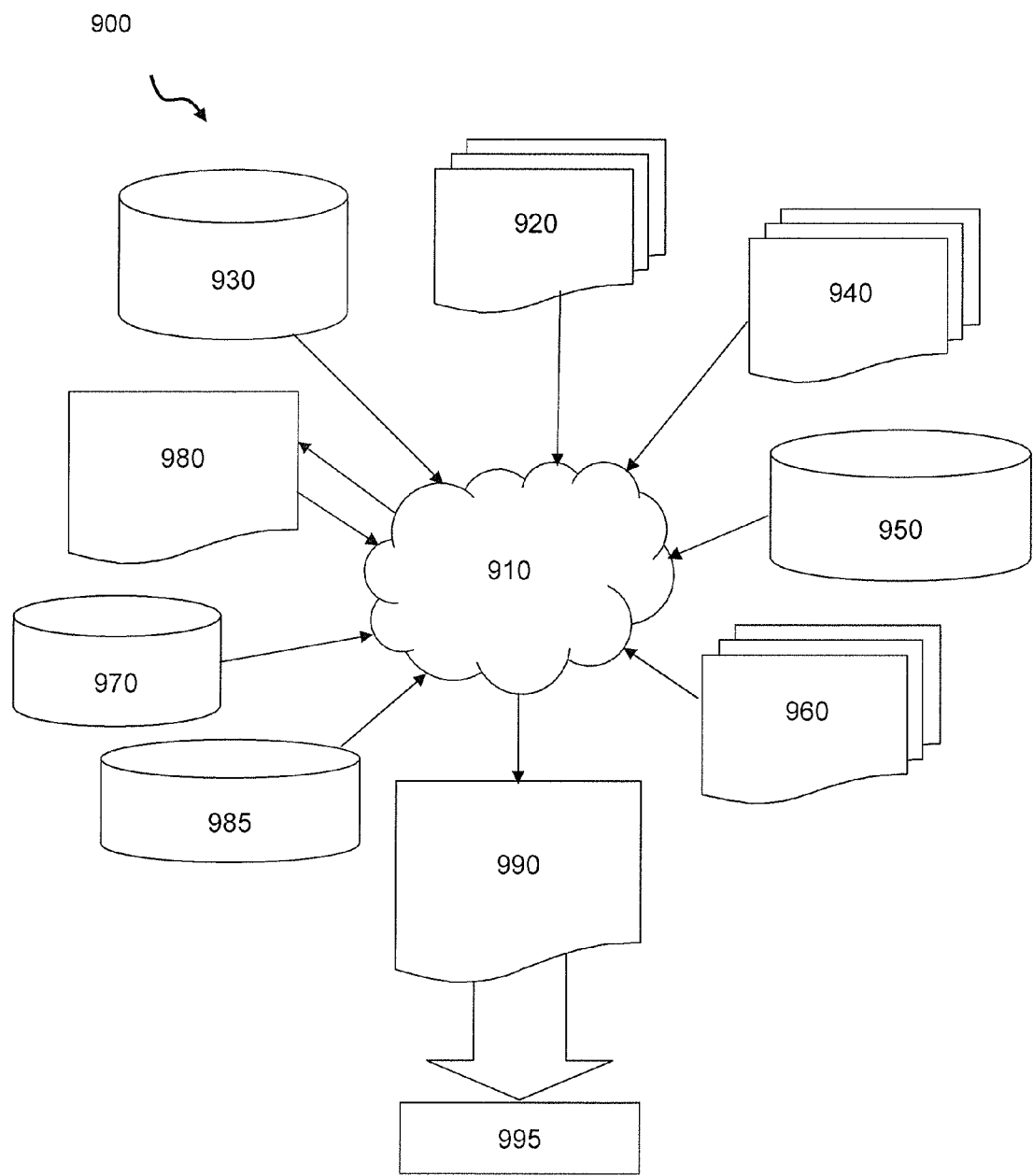
FIG. 8 is a flow diagram of a design process used in semiconductor design, manufacture, and/or test.

FIG. 8 is a flow diagram of a design process used in semiconductor design, manufacture, and/or test. FIG. 8 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-6. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-6. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-6 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-6. In one embodiment, design structure 990 may comprise a compiled, executable HDL simulation model that functionally simulates the devices shown in FIGS. 1-6.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-6. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw substrate form (that is, as a single substrate that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
   forming a plurality of fin structures on an insulator layer;
   forming a gate stack wrapping around the plurality of fin structures, the gate stack comprising a high-k dielectric material deposited on the plurality of fin structures; and
   adjusting a Vt threshold of the gate stack by subjecting the high-k dielectric material to an oxygen anneal process, wherein
   the gate stack includes the formation of a sidewall spacer on sidewalls of the gate stack,
   the sidewall spacer is formed over the high-k dielectric material, and
   the sidewall spacer on the gate stack is pulled down to expose at least the high-k dielectric material such that the high-k dielectric material is subjected to the oxygen anneal process.

2. The method of claim 1, wherein the oxygen anneal process is a lateral oxygen diffusion process performed at about 400° C. to about 500° C.

3. The method of claim 1, wherein the Vt threshold is shifted in a range from 0 to 400 mV.

4. The method of claim 1, wherein the pulling down is performed by an etching process prior to the oxygen anneal process.

5. The method of claim 4, further comprising fabricating an upper portion of the sidewall spacer on the gate stack after the oxygen anneal process, by depositing spacer material on sidewalls of the gate stack.

6. The method of claim 1, wherein the oxygen anneal process fills in oxygen vacancies in the high-k dielectric material, resulting in threshold voltage shift of the gate stack.

7. The method of claim 1, wherein the oxygen anneal process is self-limiting and avoids introduction of extra variability.

8. The method of claim 1, further comprising forming a work function metal on the high-k dielectric material.

9. The method of claim 1, wherein:
   the pulling down comprises recessing the sidewall spacer to expose one or more work function metals and the high-k dielectric material of the gate stack; and
   the subjecting to the oxygen anneal process comprises performing an oxygen anneal on the exposed or more work function metals.

10. The method of claim 9, wherein the oxygen anneal is a lateral oxygen diffusion.

11. The method of claim 10, wherein the oxygen anneal is performed at about 400° C. to about 500° C.

12. The method of claim 1, wherein the adjusting Vt threshold comprises an performing an oxygen anneal process on exposed one or more work function metals and the high-k dielectric material of the gate stack.

13. The method of claim 12, further comprising recessing a sidewall spacer on sidewalls of the gate stack, prior to the oxygen anneal process, and thereafter adding additional spacer material to complete a spacer on sidewalls of the gate stack.

14. The method of claim 1, wherein the pulling down of the sidewall spacer on the gate stack is post silicide.

15. The method of claim 14, wherein the pulling down of the sidewall spacer on the gate stack exposes work function metal of the gate stack.

16. The method of claim 15, further comprising undergoing a temperature oxygen anneal to fill in oxygen vacancies in the high-k dielectric material, resulting in threshold voltage shift of the gate structure.

17. The method of claim 16, wherein the high-k dielectric material is blanket deposited on the plurality of fin structures on an insulator layer and the insulator.

* * * * *